United States Patent
Blanchard et al.

(10) Patent No.: US 10,797,131 B2
(45) Date of Patent: Oct. 6, 2020

(54) ENHANCEMENTS TO CELL LAYOUT AND FABRICATION TECHNIQUES FOR MOS-GATED DEVICES

(71) Applicant: Pakal Technologies, Inc., San Francisco, CA (US)

(72) Inventors: Richard A. Blanchard, Los Altos, CA (US); Hidenori Akiyama, Miyagi (JP); Vladimir Rodov, Seattle, WA (US); Woytek Tworzydlo, Austin, TX (US)

(73) Assignee: Pakal Technologies, Inc., San Francisco, CA (US)

( * ) Notice: Subject to any disclaimer, the term of this patent is extended or adjusted under 35 U.S.C. 154(b) by 0 days.

(21) Appl. No.: 16/368,470

(22) Filed: Mar. 28, 2019

(65) Prior Publication Data

US 2019/0312106 A1 Oct. 10, 2019

Related U.S. Application Data

(60) Provisional application No. 62/653,104, filed on Apr. 5, 2018.

(51) Int. Cl.
*H01L 29/06* (2006.01)
*H01L 21/265* (2006.01)
(Continued)

(52) U.S. Cl.
CPC .... *H01L 29/0696* (2013.01); *H01L 21/26513* (2013.01); *H01L 21/26586* (2013.01);
(Continued)

(58) Field of Classification Search
CPC ........... H01L 29/0696; H01L 21/26586; H01L 21/26513; H01L 29/7813; H01L 29/4236;
(Continued)

(56) References Cited

U.S. PATENT DOCUMENTS 5,828,101 A 10/1998 Endo
8,890,252 B2 * 11/2014 Saikaku .............. H01L 29/7819
257/368

(Continued)

FOREIGN PATENT DOCUMENTS

JP H1027899 A 1/1998

OTHER PUBLICATIONS

EPO as ISA, PCT/US2019/025235, "International Search Report and Written Opinion," dated Oct. 4, 2019, 15 pages.

*Primary Examiner* — Galina G Yushina
(74) *Attorney, Agent, or Firm* — Patent Law Group; Brian D. Ogonowsky

(57) ABSTRACT

An insulated gate turn-off (IGTO) device, formed as a die, has a layered structure including a p+ layer (e.g., a substrate), an n− epi layer, a p-well, trenched insulated gate regions formed in the p-well, and n+ regions between the gate regions, so that vertical NPN and PNP transistors are formed. The device may be formed of a matrix of cells or may be interdigitated. To turn the device on, a positive voltage is applied to the gate, referenced to the cathode. The cells further contain a vertical p-channel MOSFET, for rapidly turning the device off. The p-channel MOSFET may be made a depletion mode device by implanting boron ions at an angle into the trenches to create a p-channel. This allows the IGTO device to be turned off with a zero gate voltage while in a latch-up condition, when the device is acting like a thyristor.

8 Claims, 18 Drawing Sheets

(51) Int. Cl.
  *H01L 29/78* (2006.01)
  *H01L 29/423* (2006.01)
  *H01L 29/745* (2006.01)
  *H01L 29/739* (2006.01)
  *H01L 21/28* (2006.01)

(52) U.S. Cl.
  CPC .... *H01L 21/28017* (2013.01); *H01L 29/4236* (2013.01); *H01L 29/7397* (2013.01); *H01L 29/7455* (2013.01); *H01L 29/7813* (2013.01)

(58) Field of Classification Search
  CPC ............. H01L 29/7455; H01L 29/7397; H01L 21/28017; H01L 29/0839; H01L 29/102; H01L 29/1095; H01L 29/4238; H01L 29/6634; H01L 29/66363
  See application file for complete search history.

(56) References Cited

U.S. PATENT DOCUMENTS

| | | | |
|---|---|---|---|
| 2009/0008674 A1* | 1/2009 | Udrea | H01L 29/66348 257/138 |
| 2011/0193131 A1 | 8/2011 | Blanchard et al. | |
| 2015/0076554 A1 | 3/2015 | Laven et al. | |
| 2015/0349104 A1 | 12/2015 | Rodov et al. | |
| 2017/0012108 A1* | 1/2017 | Sakakibara | H01L 29/0886 |
| 2019/0312106 A1* | 10/2019 | Blanchard | H01L 21/26513 |

* cited by examiner

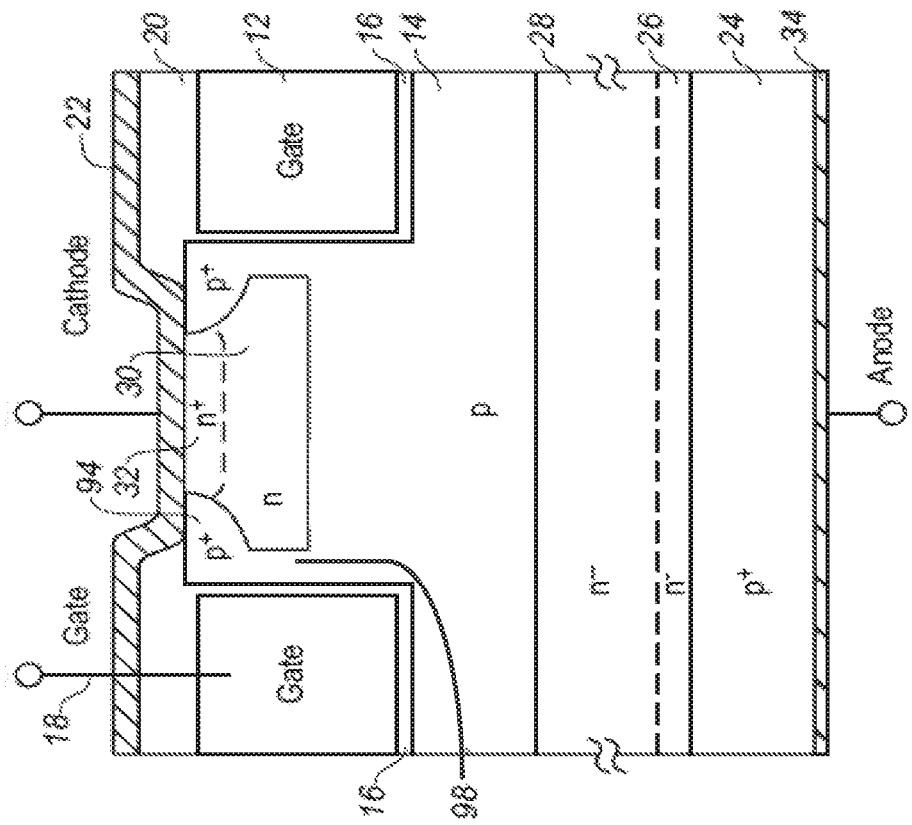

ENHANCEMENTS TO CELL LAYOUT AND FABRICATION TECHNIQUES FOR MOS-GATED DEVICES

CROSS-REFERENCE TO RELATED APPLICATIONS

This application is based on provisional application Ser. No. 62/653,104, filed Apr. 5, 2018, by Richard A. Blanchard et al., assigned to the present assignee and incorporated herein by reference.

FIELD OF THE INVENTION

This invention relates to insulated gate turn-off (IGTO) devices and, more particularly, to improvements in cell layouts and fabrication techniques for forming an IGTO device that includes an integrated turn-off transistor for faster removal of carriers when turning off the device.

BACKGROUND

Prior art FIG. 1 is a cross-section of a small portion of an IGTO device 10 (similar in some respects to a thyristor) of the type described in the assignee's U.S. Pat. No. 9,391,184, incorporated herein by reference. The device 10 includes a plurality of cells having vertical gates 12 formed in insulated trenches. A 2-dimensional array of the cells may be formed in a common p-well 14, and the cells are connected in parallel. The gates 12 are formed as a continuous rectangular mesh.

The vertical gates 12 are insulated from the p-well 14 by an oxide layer 16. The narrow gates 12 (doped polysilicon) are connected together outside the plane of the drawing and are coupled to a gate voltage via the gate electrode 18 contacting the polysilicon. A patterned dielectric layer 20 insulates a cathode metal 22 (cathode electrode) from the gates 12. The dielectric layer 20 thickness between the top of the gates 12 and the cathode metal 22 is much larger than the gate oxide 16 thickness.

An NPNP semiconductor layered structure is formed. There is a bipolar PNP transistor formed by a p+ substrate 24, an n− epitaxial (epi) buffer layer 26, a relatively thick and more lightly doped n− epi layer 28, and the p− well 14. There is also a bipolar NPN transistor formed by the n-epi buffer layer 26, the n− epi layer 28, the p-well 14, the n layer 30, and the n+ source 32. The n-epi buffer layer 26, with a dopant concentration higher than that of the n− epi layer 28, reduces the injection of holes into the n− epi layer 28 from the p+ substrate 24 when the device is conducting. A bottom anode metal 34 (anode electrode) contacts the substrate 24, and the cathode metal 22 contacts the n+ source 32. The p-well 14 surrounds the gate structure.

When the anode metal 34 is forward biased with respect to the cathode metal 22, but without a sufficiently positive gate bias, there is no current flow, since the product of the betas (gains) of the PNP and NPN transistors is less than one (i.e., there is no regeneration activity). Additionally, emitter-to-base shorts are distributed throughout the device, providing an additional reduction in gains.

When the gate is forward biased, electrons from the n+ source 32 become the majority carriers along the gate sidewalls and below the bottom of the trenches in an inversion layer, causing the effective width of the NPN base (the portion of the p-well 14 between the n-layers) to be reduced. As a result, the beta of the NPN transistor increases to cause the product of the betas to exceed one. This results in "breakover," when holes are injected into the lightly doped n− epi layer 28 and electrons are injected into the p-well 14 to fully turn on the device. Accordingly, the gate bias initiates the turn-on, and the full turn-on (due to regenerative action) occurs when there is current flow through the NPN transistor as well as current flow through the PNP transistor. During this latch-up, the on-voltage across the device is desirably lower, and the device acts as a thyristor.

A p+ region 36 is formed on both sides of the n+ source 32, adjacent the gate 12, and extends below the n+ source 32. The n layer 30 extends below the p+ region 36 to form a channel in a vertical p-channel MOSFET. The p+ regions 36 and the n+ source 32 are shorted together by the cathode metal 22.

When the gate voltage applied to the gate electrode 18 is above the threshold for turn-on of the IGTO device, the vertical p-channel MOSFET is off and has no effect on the operation. When the current through the IGTO device is sufficiently high, thyristor action is initiated, and the device can be turned off simply by shorting the gate to the cathode metal 22. By applying a gate voltage sufficiently lower than the cathode voltage (to exceed the threshold voltage of the p-channel MOSFET), the n layer 30 adjacent to the gate 12 inverts to create a p-channel between the p+ region 36 and the p-well 14. This conducting p-channel MOSFET hastens turn-off by shorting the base-emitter diode of the vertical NPN transistor, forcing the NPN transistor to turn off. Therefore, there is no further regenerative action. The doping level of the n layer 30 determines the threshold voltage of the "enhancement mode" p-channel MOSFET. Additionally, majority carriers in the p-well 14 are rapidly removed from the p-well 14 (via the cathode metal 22) when the p-channel MOSFET conducts, greatly reducing the turn-off time.

The maximum current that can be turned off using the p-channel "pull-down" MOSFET is also increased due to the p-channel MOSFET forcing the turn off of the NPN transistor by electrically connecting its base to its emitter when the p-channel MOSFET is turned on.

FIG. 2 is a top down view of the rectangular area surrounded by the cell's gate 12. The cathode metal 22 is not shown. The p+ regions 36 may take up any portion of the semiconductor surface. A larger area taken up by the p+ regions 36, relative to the n+ source 32, improves the turn-off time but undesirably increases the on-resistance. A much larger p+ region 36 may be continuous around the inner wall of the gate in a cell, or make up any other portion of the semiconductor surface.

FIG. 2 shows a minimum-width cathode metal contact area 40 (an etched opening in the dielectric layer 20) that results in the cathode metal directly contacting both the p+ regions 36 and the n+ source 32.

FIG. 3 is taken across the IGTO device 10 along line 3-3 in FIG. 2. When the device 10 is conducting, the electron flow 44 from the n+ source 32 takes a relatively short horizontal path near the surface and flows vertically near the gate 12 where the n layer 30 has the least resistance in the on-state. In the p-well 14, the electron flow 44 spreads out.

FIG. 4 is taken across the IGTO device 10 along line 4-4 in FIG. 2. In FIG. 4, due to the p+ regions 36, the electron flow 46 must take a different path through the n layer 30, which has a resistance that is higher than along the gate 12 shown in FIG. 3. As a result, the resistance and forward voltage (Vf) are increased due to the p+ regions 36.

Therefore, a compromise must be made between the lowest on-resistance and the shortest turn-off time.

FIG. 5 illustrates a normalized forward voltage (Vf) curve and a normalized turn-off time curve versus the percentage area of the pull-down MOSFET area. The Vf, related to on-resistance, increases with the percentage area of the pull-down MOSFET due to the redirected current flow shown in FIG. 4, but the turn-off time decreases with the percentage area of the pull-down MOSFET. Simulations have shown that the turn-off energy does not significantly vary once the percentage of the pull-down MOSFET exceeds about 50%.

The gate-to-gate spacing is also very relevant to Vf, since a higher density of gates results in more low-resistance vertical paths for the electrons from the n+ source 32 when the device is on. FIG. 6 is identical to FIG. 1 but identifies the gate-to-gate spacing (e.g., 1.5-2.0 microns) and the required minimum contact opening in any top dielectric layer for the cathode metal 22 to contact both the p+ regions 36 and the n+ source 32. By reducing the minimum contact opening width, opposing gate walls can be closer together, improving surface utilization and, therefore, Vf.

FIG. 7 illustrates the effect of gate-to-gate spacing on Vf for three cathode-anode voltages V1, V2, and V3, where V3>V2>V1. To the left of the line 48, there is increasing pinch-off of the vertical conduction path due to the gate-to-gate spacing being too narrow and, to the right of the line 48, conduction area is being wasted by the gate-to-gate spacing being too high. As seen, there is an optimized gate-to-gate spacing along line 48. However, the shape and percentage area of the pull-down MOSFET between the gates limits the gate-to-gate spacing, since the cathode metal must contact both the p+ region 36 and the n+ source 32.

Although the device of FIG. 1 has proven to be an improvement over other prior art MOS-gated devices, it is desirable to further improve the device by improvements in the dimensions of the cells, the shape and relative size of the pull-down MOSFET, and other characteristics.

SUMMARY

This disclosure describes a wide variety of cell designs that enable optimal gate-to-gate spacing while also optimizing the size of the pull-down MOSFET. As a result, both Vf and turn-off time are reduced. This disclosure describes cell layouts that have a higher layout efficiency compared to the layouts described in the prior art, where an improvement in layout efficiency results in a lower Vf for the same area.

Additionally, a technique for changing the threshold voltage (Vth) of the pull-down p-channel MOSFET, including even making it a depletion mode pull-down MOSFET (rather than the prior art enhancement mode pull-down MOSFET), is described. In this new technique, boron ions are implanted in the sides of the trenches at an angle, so only the upper and middle portions of the trench walls are doped with the p-type dopant. The boron ions are implanted in areas that will eventually be the channel region of the pull-down p-channel MOSFET. This additional p-type doping changes the threshold voltage (Vth) of the p-channel MOSFET to any selected degree. Therefore, the gate turn-off voltage of the IGTO device can be customized.

If the dose of the boron ions is sufficiently large, the angled implant creates a depletion channel in a depletion mode vertical pull-down MOSFET. In this instance, the pull-down MOSFET conducts at a zero gate voltage when the IGTO device is off. When the gate voltage is positive and above the threshold voltage of the IGTO device (the device is on), the depletion mode pull-down MOSFET is turned off so has no effect. By simply removing the gate voltage to turn off the IGTO device, the depletion mode pull-down MOSFET conducts to turn off the vertical NPN transistor as well as to quickly remove carriers from the p-well.

Other improvements are disclosed.

BRIEF DESCRIPTION OF THE DRAWINGS

FIG. 25 is similar to FIG. 1 except that a depletion mode pull-down MOSFET is formed, rather than an enhancement mode pull-down MOSFET.

FIG. 26 is a cross-section of an empty trench formed in an n-type epi layer, such as the n-type epi layer of FIG. 21.

FIG. 27 illustrates the formation of the resulting narrow p− region that will be the channel of the depletion mode pull-down MOSFET.

Elements that are the same or equivalent are labelled with the same numerals.

DETAILED DESCRIPTION

The novel cell designs and MOSFET structures described below can also be used in vertical devices other than the type of IGTO device shown in FIG. 1. For example, the designs and structures could also improve the performance of insulated gate bipolar transistor (IGBT) devices.

Figure 8:
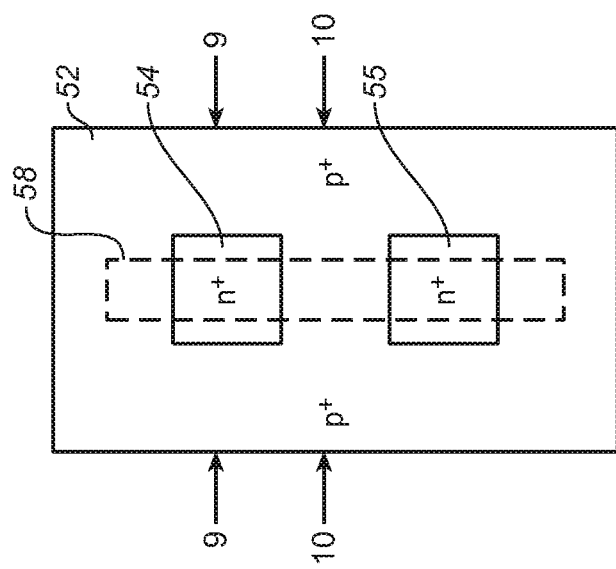
FIG. 8 is a top down view of a portion of a cell of an IGTO device between two vertical gates.
Figure 6:
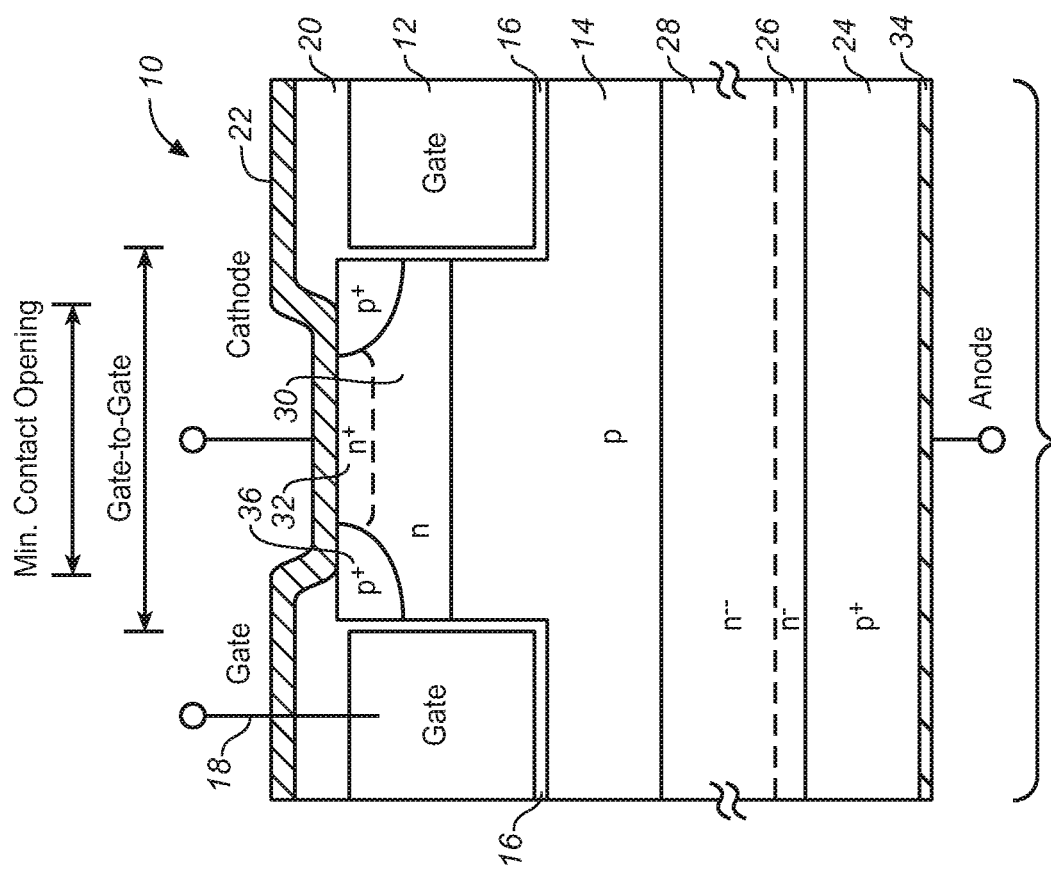
FIG. 6 is identical to FIG. 1 but identifies the gate-to-gate spacing and the required minimum contact opening in any top dielectric layer for the cathode metal to contact both the p+ regions and the n+ source.
Figure 9:
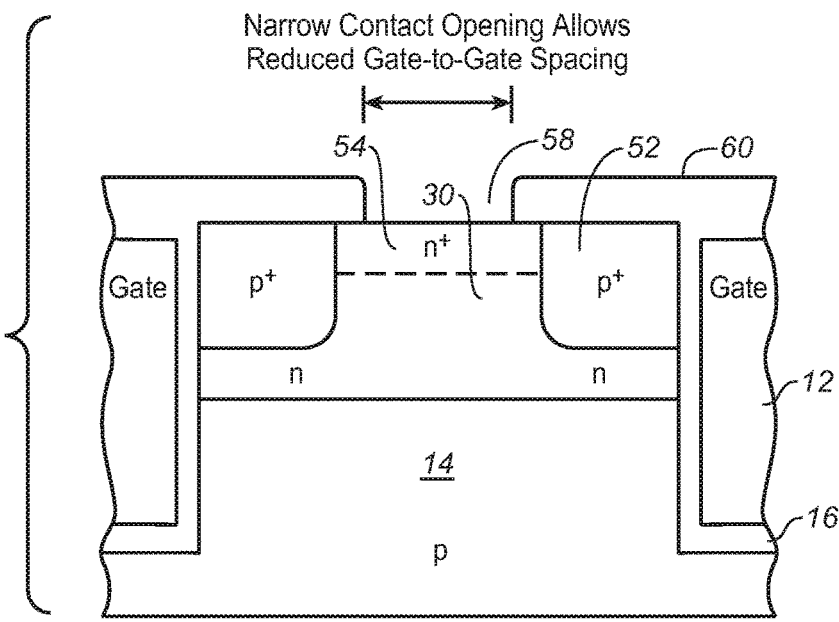
FIG. 9 is taken across line 9-9 in FIG. 8.

FIG. 8 is a top down view of a portion of a cell of an IGTO device between two vertical gates. FIG. 9 is taken across line 9-9 in FIG. 8, and FIG. 10 is taken across line 10-10 in FIG. 8.

Figure 10:
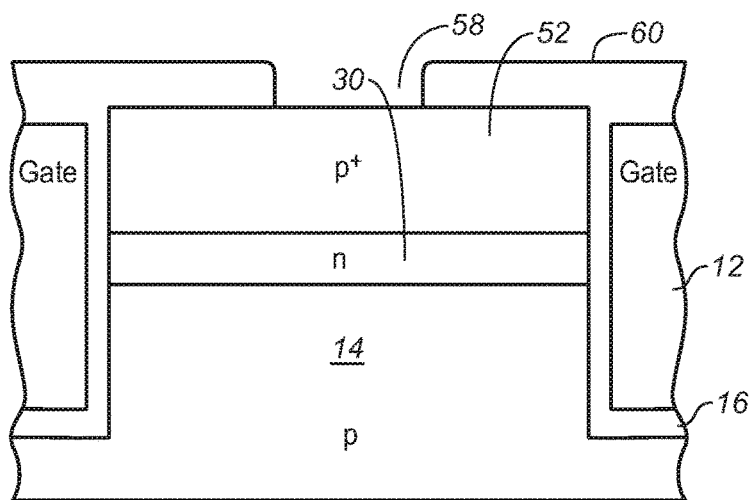
FIG. 10 is taken across line 10-10 in FIG. 8.

FIGS. 9 and 10 do not show any part of the cell below the p-well 14, but the remainder may be similar to that shown in FIG. 1, where the n-type layers 26 and 28 and p+ substrate 34 are below the p-well 14. In another embodiment, the gate may extend completely through the p-well 14 (rather than terminate within the p-well 14), causing the device to be similar to an IGBT. This gate extension to form an IGBT applies to all the embodiments.

Figure 2:
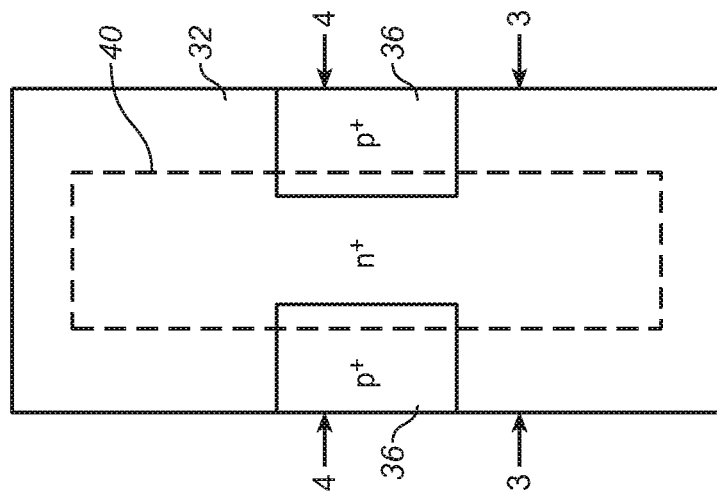
FIG. 2 is a top down view of the area between the two gates in FIG. 1.

One significant difference between the configurations of the p+ region 52 and the n+ sources 54 and 55 of FIG. 8 and the p+ region 36 and the n+ source 32 of FIG. 2 is that there is a gap between the two n+ sources 54 and 55. Within the gap is a portion of the p+ region 52. The p+ region 52 forms part of the pull-down MOSFET used for rapidly turning off the IGTO device. The area of the p+ region 52 surrounding the n+ sources 54 and 55 and abutting the gates may be made much narrower to reduce pinching off the electron flow and allow closer gate-to-gate spacing. Hence, the most relevant aspect of FIG. 8 is the horizontal layout of the p+ region 52 between the n+ sources 54 and 55, which extends to the sides of the gates. The remainder of the p+ region 52 can even be deleted to increase the percentage area of the n+ sources 54 and 55 along the gates to improve the forward voltage Vf.

The contact opening 58 in the dielectric 60 (FIG. 9) can be very narrow since the cathode metal (over the dielectric 60 and in the contact opening 58) only needs to directly contact a portion of the horizontal strip of the p+ region 52 and the n+ sources 54 and 55. This enables the gate-to-gate spacing to be smaller to increase the cell density and reduce the Vf.

Figure 11:
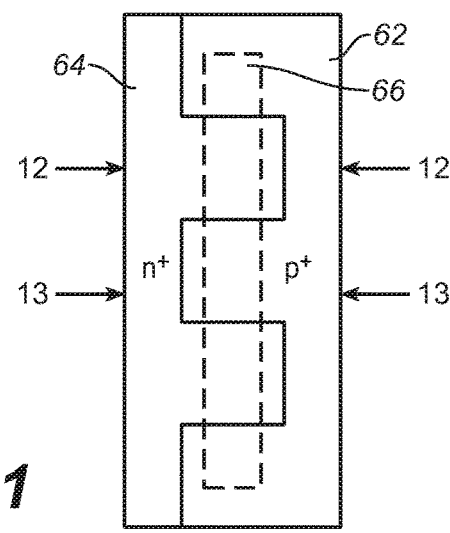
FIG. 11 illustrates another design of the p+ region relative to the n+ source.
Figure 12:
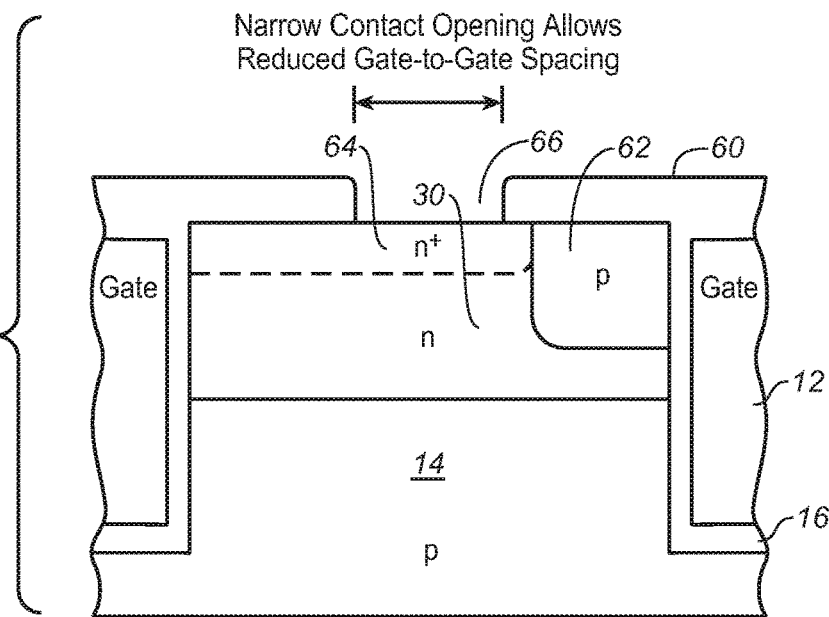
FIG. 12 is taken across line 12-12 in FIG. 11.
Figure 13:
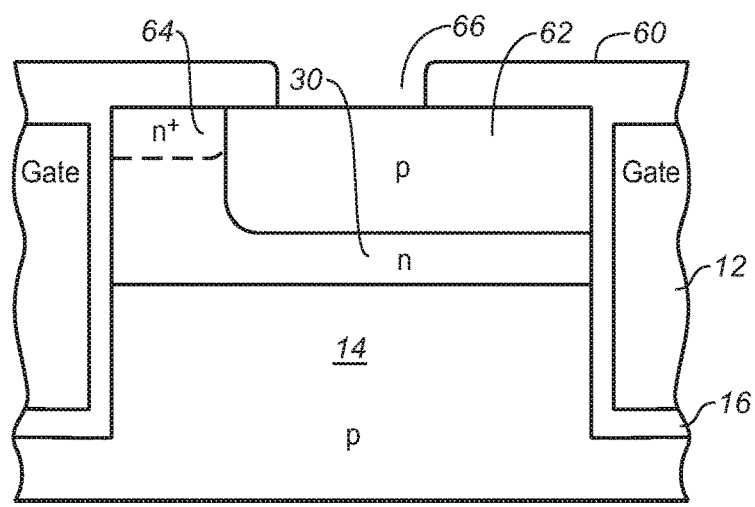
FIG. 13 is taken across line 13-13 in FIG. 11.

FIG. 11 illustrates another design of the p+ region 62 of a pull-down p-channel MOSFET relative to the n+ source 64. FIG. 12 is taken across line 12-12 in FIG. 11, and FIG. 13 is taken across line 13-13 in FIG. 11. In this embodiment, the relative size of the n+ source 64 is increased for improved Vf, yet the contact opening 66 for the cathode metal can be very narrow, allowing smaller gate-to-gate spacing for improved Vf. The p+ region 62 has horizontal fingers that extend into the n+ source 62, where the horizontal fingers are contacted by the cathode metal. As in FIGS. 9 and 10, the layers below the p-well 14 are not shown but may be similar to those layers in FIG. 1 or layers for forming an IGBT.

FIGS. 12 and 13 illustrate that the p+ region 62 does not extend along the wall of one of the opposing gates 12, and the n+ source 64 does not extend along the wall of the other one of the gates 12. In this embodiment, the percentage area of the p+ region 62 is about 50% of the top area between the gates 12. Since the n+ source 64 is relatively large and next to one of the gate walls, there is very low on-resistance, since electrons injected by the n+ source 64 do not need to flow horizontally through the higher resistance n layer 30. The n layer 30 along the gate wall is highly conductive when the IGTO device is on. As a result, the Vf, and turn-off time are very low.

Figure 1:
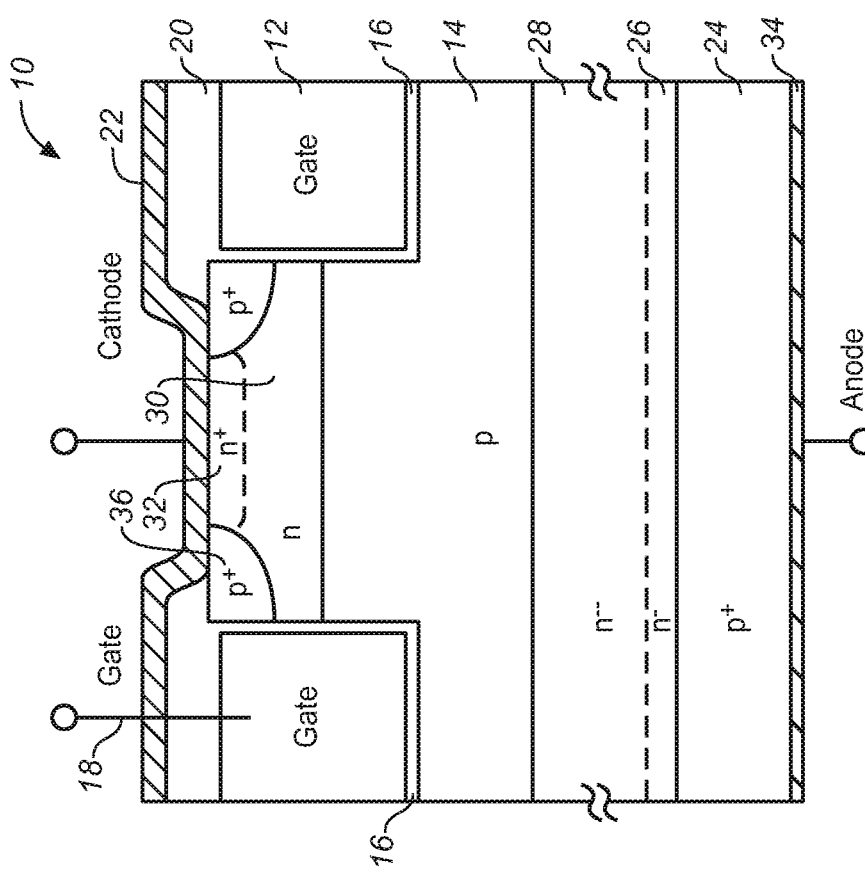
FIG. 1 is a cross-section of a small portion of an IGTO device of a type described in the assignee's U.S. Pat. No. 9,391,184.
Figure 4:
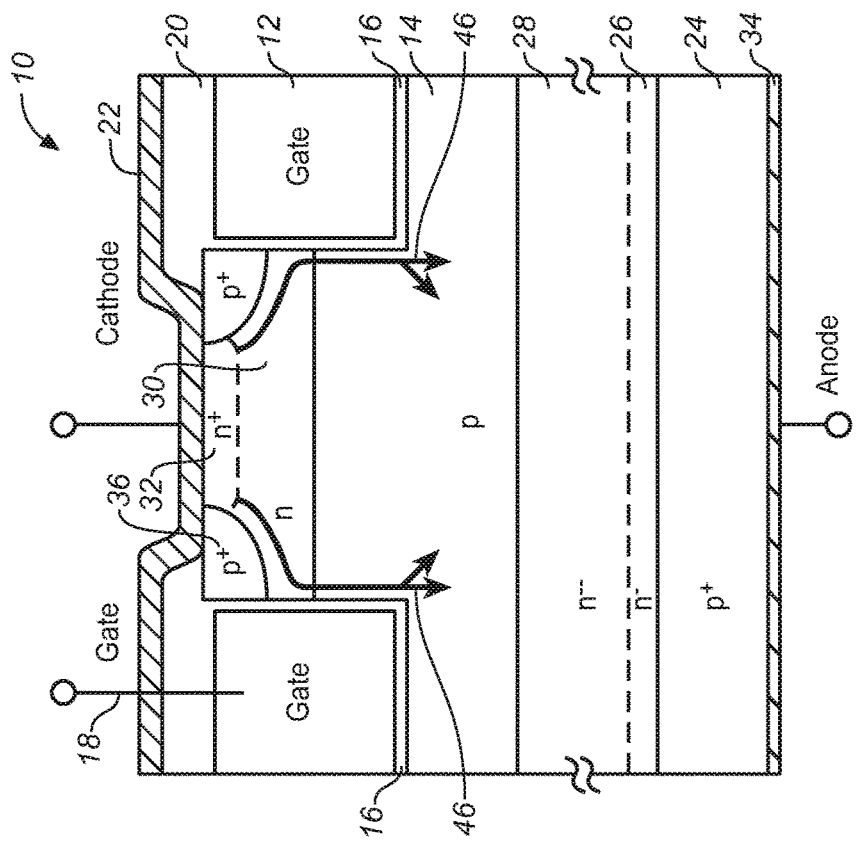
FIG. 4 is taken across the IGTO device along line 4-4 in FIG. 2.
Figure 3:
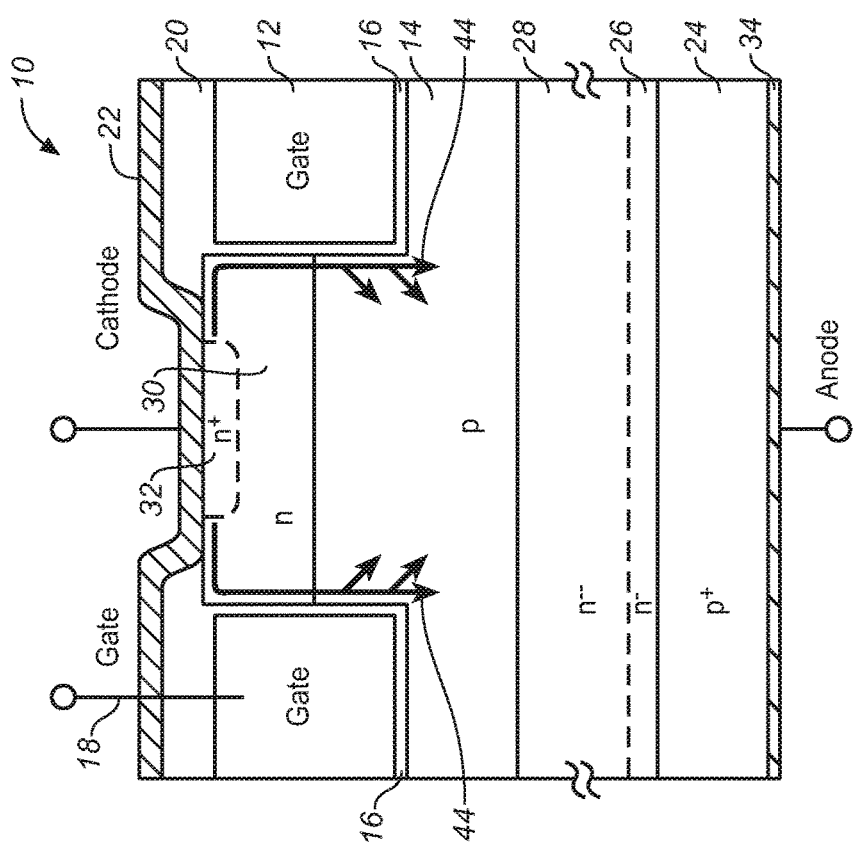
FIG. 3 is taken across the IGTO device along line 3-3 in FIG. 2.
Figure 5:
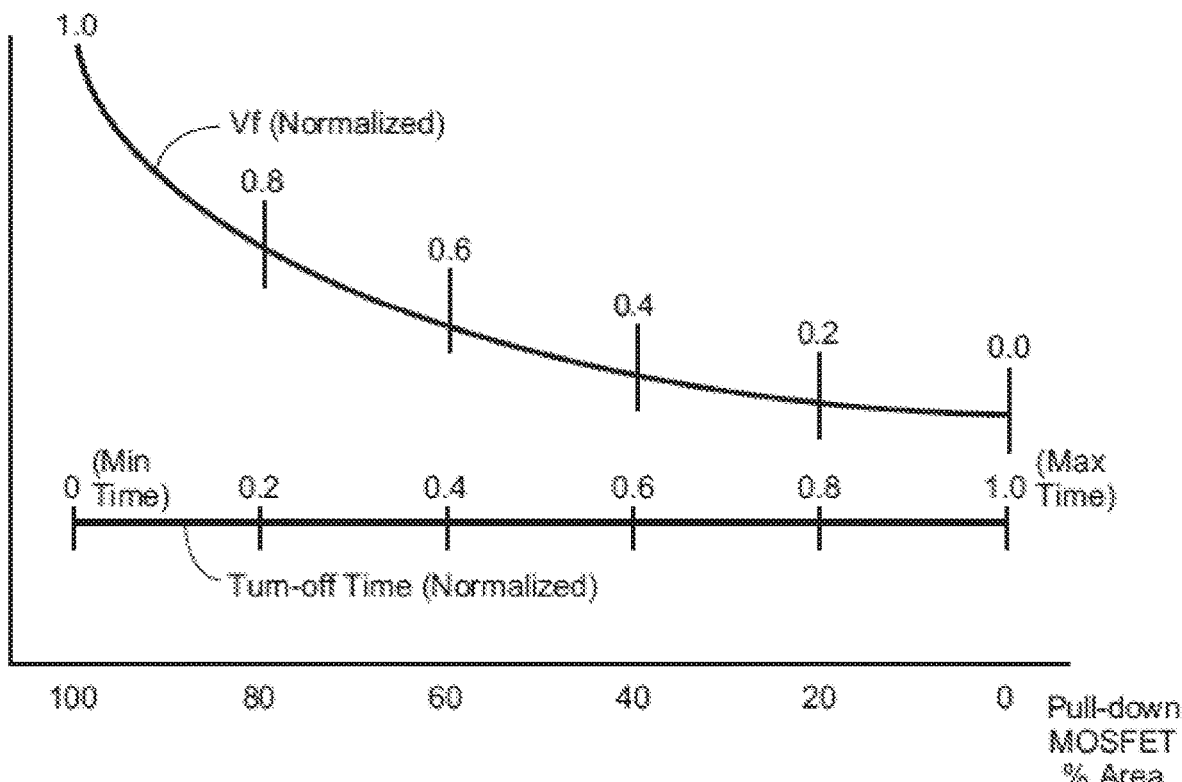
FIG. 5 illustrates a normalized forward voltage (Vf) curve and a normalized turn-off time curve versus the percentage area of the pull-down MOSFET area.
Figure 7:
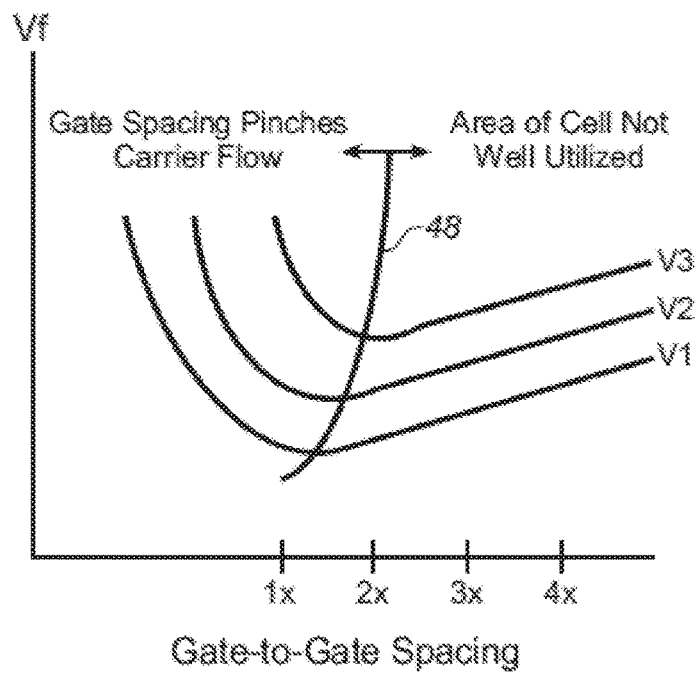
FIG. 7 illustrates the effect of gate-to-gate spacing on Vf for three cathode-anode voltages.
Figure 14:
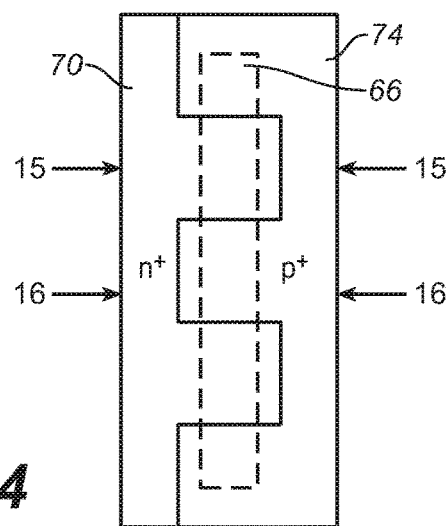
FIG. 14 illustrates an embodiment of an IGTO device, where the n layer in FIGS. 1, 9, and 12 is not formed below the n+ source.
Figure 15:
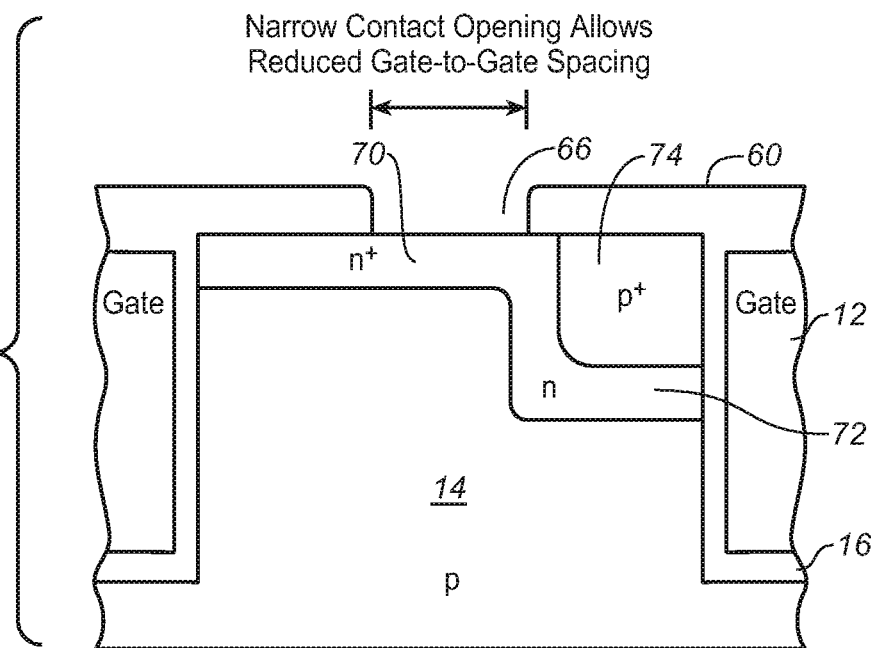
FIG. 15 is taken across line 15-15 in FIG. 14.
Figure 16:
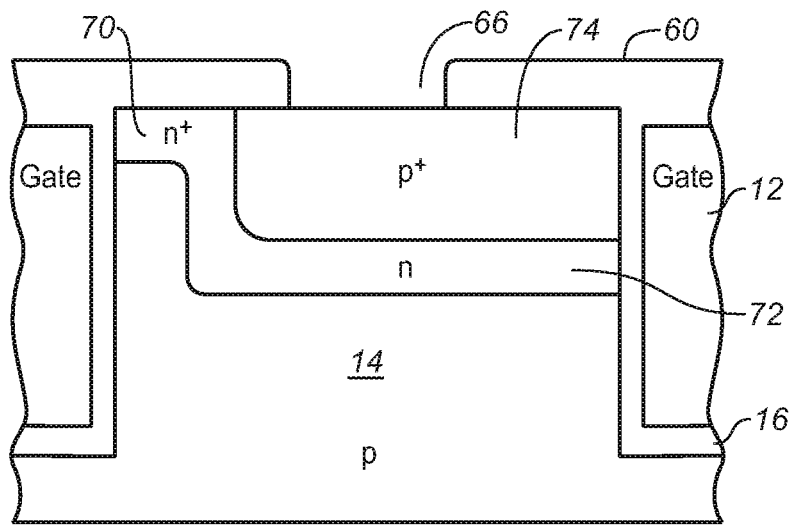
FIG. 16 is taken across line 16-16 in FIG. 14.

FIGS. 14-16 illustrate an embodiment of an IGTO device that includes a pull-down p-channel MOSFET, where the n layer 30 in FIGS. 1, 9, and 12 is not formed below the n+ source 70. FIG. 15 is taken across line 15-15 in FIG. 14, and FIG. 16 is taken across line 16-16 in FIG. 14. In FIGS. 14-16, the n layer 72 is only formed below the p+ region 74 and connects to the n+ source 70. Since the n+ source 70 extends to the gate wall, there is a very low resistance path from the n+ source 70 to below the gate 12, due to the inversion of the p-well 14 next to the gate 12. The narrow contact opening 66 is similar to that shown in FIG. 11 so the gate-to-gate spacing may be small (e.g., less than 1.5 microns).

Figure 17:
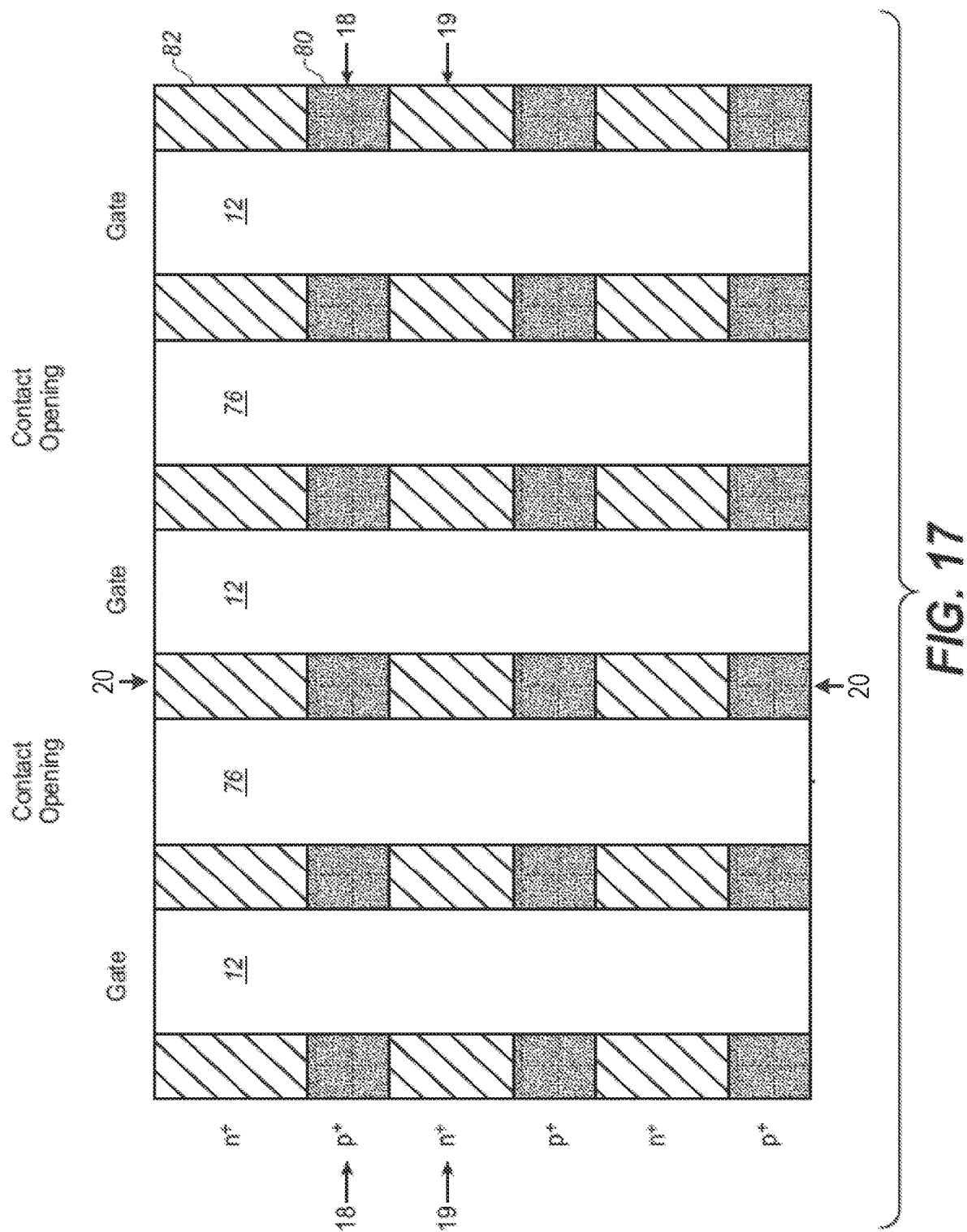
FIG. 17 is a top down view of a portion of two cells between opposing gates in an IGTO device.

FIG. 17 is a top down view of a portion of two cells between opposing gates 12 in an IGTO device having a pull-down p-channel MOSFET. The gates 12 are within trenches formed as a rectangular mesh of trenches. The rectangular cells will typically be elongated, and the horizontal regions of the gates 12 are not shown. The narrow rectangular contact openings 76 in a dielectric layer 78 (FIG. 18) over the gates 12 and over a portion of the semiconductor are shown. The cathode metal (not shown) overlies the dielectric 78 and directly contacts the exposed semiconductor surface.

Figure 18:
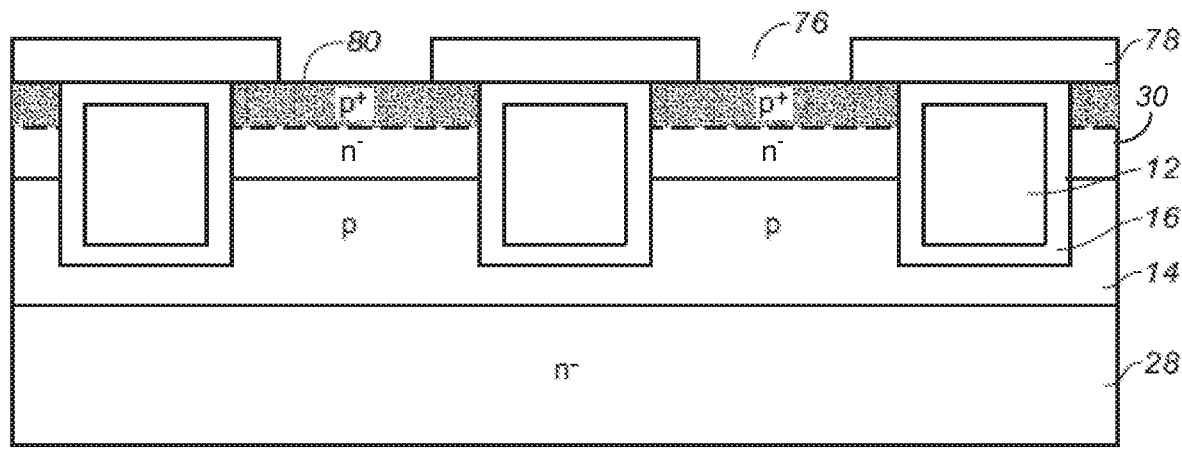
FIG. 18 is a cross-section along line 18-18 in FIG. 17.
Figure 19:
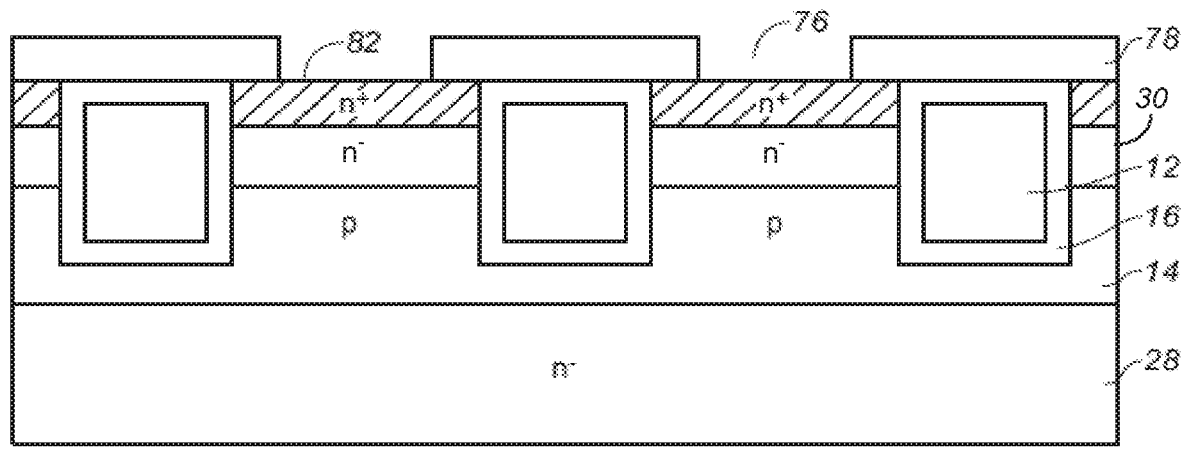
FIG. 19 is a cross-section along line 19-19 in FIG. 17.
Figure 20:
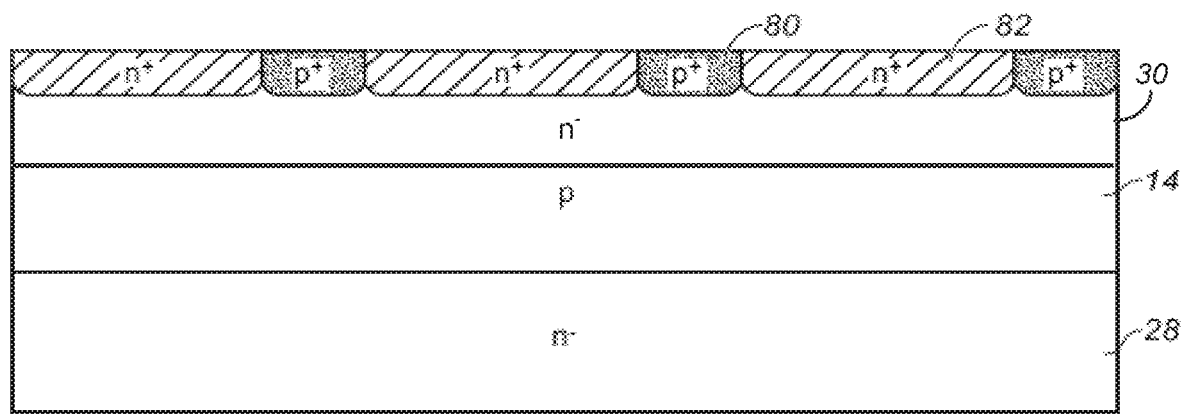
FIG. 20 is a cross-section along line 20-20 in FIG. 17.

The p+ regions 80 and n+ sources 82 are formed in strips perpendicular to the long edge of the rectangular cells. FIG. 18 is a cross-section along line 18-18 in FIG. 17; FIG. 19 is a cross-section along line 19-19 in FIG. 17; and FIG. 20 is a cross-section along line 20-20 in FIG. 17.

The contact opening 76 can be made any width, while still allowing the cathode metal to contact all the rows of the p+ regions 80 and the n+ sources 82, to optimize the gate-to-gate spacing for optimizing Vf and turn-off time.

In another embodiment, there is only a single row of the p+ region 80 per cell to increase the n+ source 82 area per cell.

FIGS. 21-24 are process flow cross-sections across a single cell in an IGTO device to illustrate a technique to form a self-aligned cathode metal without having to form a contact opening. So there is a savings in not having to form an extra dielectric layer, aligning a contact opening mask, and then etching the contact opening. This basic process may be used to form the various IGTO devices described herein.

Figure 21:
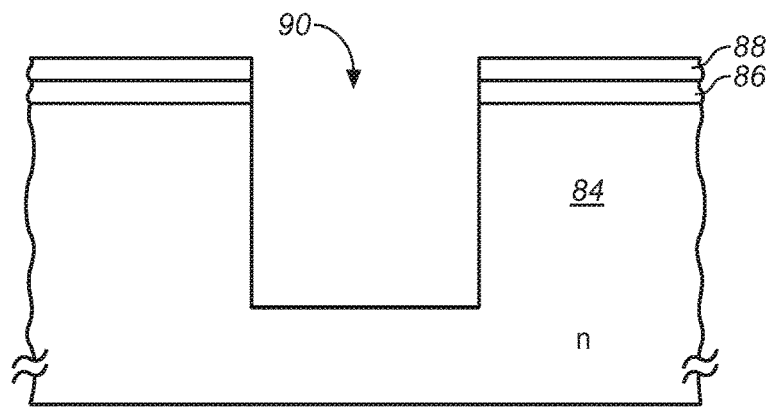
FIGS. 21-24 are process flow cross-sections across a single cell in an IGTO device to illustrate a technique to form a self-aligned cathode metal without having to form a contact opening.

In FIG. 21, an n-type epitaxial (epi) layer 84, forming the layers 26 and 28 in FIG. 1 and in the other embodiments, is grown over a p+ substrate (e.g., substrate 34 in FIG. 1). An oxide layer 86 is formed over the surface of the n-type epi layer 84. A silicon nitride layer 88 is then deposited over the oxide layer 86. The layers 86 and 88 are then masked and etched to expose a trench area for the gates. The trenches 90 are then etched using reactive ion etching (RIE).

Figure 22:
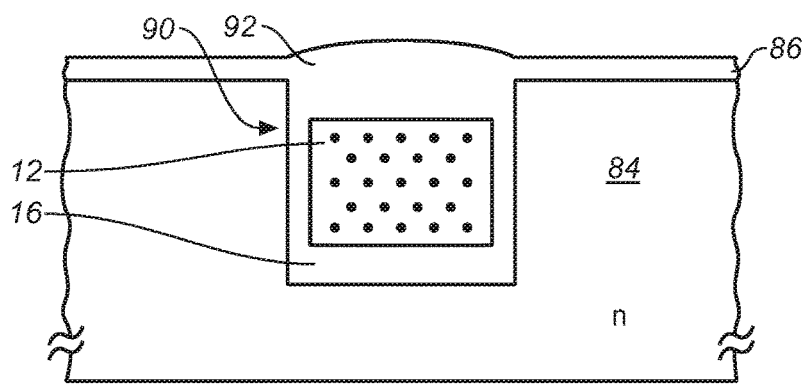

In FIG. 22, a thin gate oxide 16 is thermally grown over the sidewalls of the trench 90. Doped polysilicon is then deposited in the insulated trenches to form the conductive gate 12. Excess polysilicon is etched away. The top of the polysilicon is then oxidized to form a relatively thick oxide layer 92 over the gate 12 so the gate 12 potential will not be affected by the cathode metal voltage. The silicon nitride layer 88 is then etched away.

Figure 23:
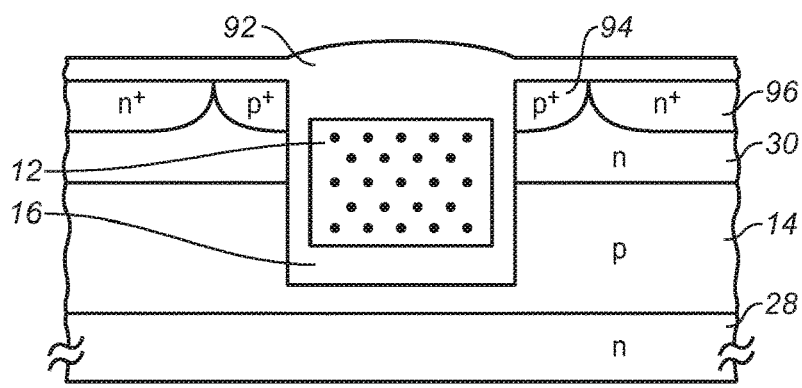

In FIG. 23, an implant step implants p-type boron ions into the n-epi layer 84 to form the p-well 14. The boron dopant is then diffused. Another implant step implants n-type phosphorus ions into the surface of the n-type epi layer 84 to form the n layer 30. The phosphorus atoms are then diffused. The surface is masked, and boron is implanted and diffused (by annealing) to form the p+ regions 94 for the pull-down MOSFET. The p+ region 94 configuration may be like any of those previously described. The surface is then masked, and arsenic is implanted and diffused (by annealing) to form the n+ source 96.

Figure 24:
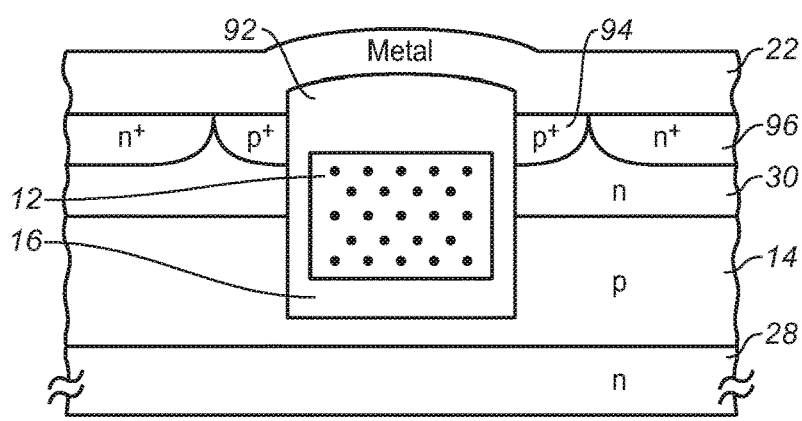

In FIG. 24, a blanket etch is performed to expose the semiconductor surface between the gates 12. The cathode metal 22 is then deposited and etched. The cathode metal 22 contacts the p+ region 94 and the n+ region 96. As seen, no contact opening mask and etch are required in this area since the oxide 92 over the gate 12 is initially thick and can be etched back during the blanket etch that exposes the active area between the gates 12. A mask and etch may be required to connect a metal gate electrode to the gate polysilicon.

FIGS. 25-32 are directed to a technique to adjust the Vth of the pull-down p-channel MOSFET, including forming a depletion mode pull-down MOSFET, using a novel angled boron implant into the sidewalls of the trenches. Adjusting the Vth can be used to customize the gate turn-off voltage of the IGTO device.

FIG. 25 is similar to FIG. 1 except that a depletion mode pull-down MOSFET is formed, rather than an enhancement mode pull-down MOSFET. A depletion mode MOSFET conducts current when there is a zero gate-source voltage, since the channel 98 between the p-well 14 and the p+ region 94 is p-type. Therefore, the channel of the depletion mode pull-down MOSFET conducts at a zero gate voltage when the IGTO device is off. When the gate voltage is positive and above the threshold voltage of the IGTO device (the device is on), the depletion mode pull-down MOSFET is turned off so has no effect. By simply taking the gate voltage to zero volts, the pull-down MOSFET conducts to turn off the vertical NPN transistor and quickly remove carriers from the p-well 14. Accordingly, no negative voltage generator is needed to generate the negative voltage that is needed to turn off the enhancement mode pull-down MOSFET of prior art FIG. 1.

FIG. 26 is a cross-section of an empty trench 102 formed in an n-type epi layer 104, such as the n-type epi layer 84 of FIG. 21. The gate oxide 16 may or may not be present. Boron 106 is then implanted at an angle relative to the vertical sidewalls of the trench 102, using the edge of the trench 102 to block the boron 106 from being implanted below a certain level of the trench 102. An implant dose of 10e12-5e14 is used in one embodiment. For the angled implant, the wafer may be angled with respect to the boron source. The angle determines the length of the p-channel in a depletion mode MOSFET. Both sidewalls of the trench 102 may be subjected to separate angled implants. The boron 106 is then diffused by an anneal step to activate the dopants.

FIG. 27 illustrates the formation of the resulting narrow p− region 108 that will be the channel of the depletion mode pull-down MOSFET.

Figure 28:
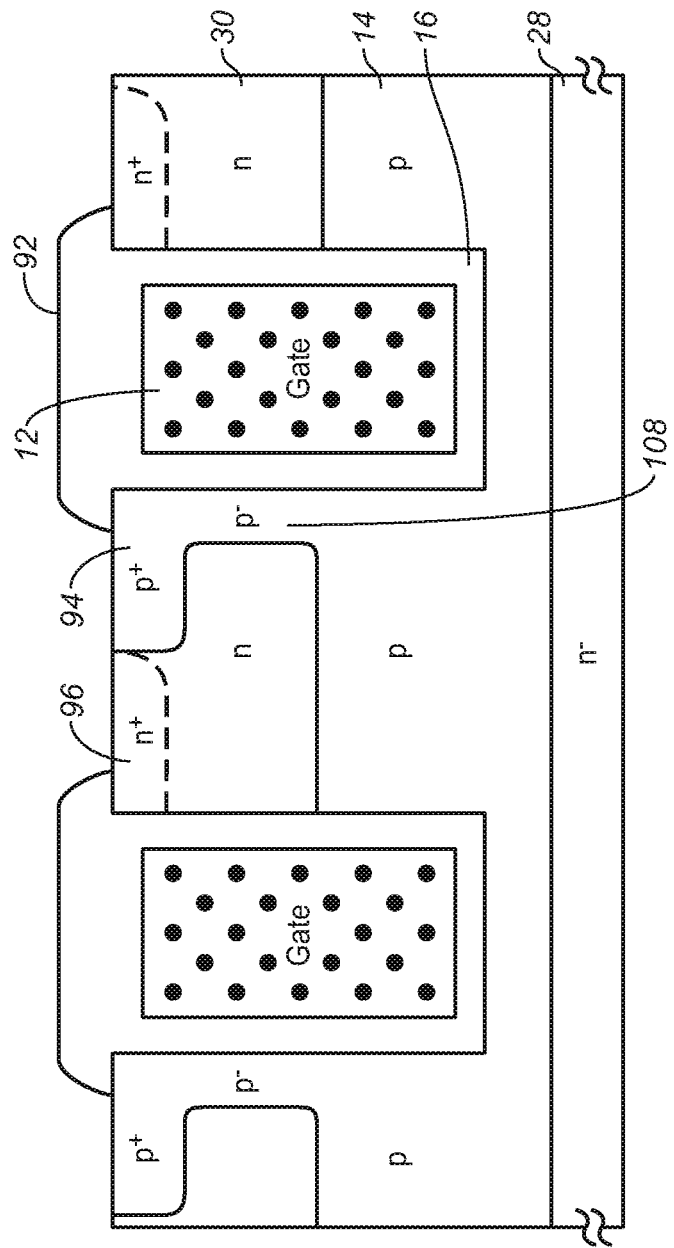
FIG. 28 illustrates various features being formed, as described with respect to FIGS. 21-24.

In FIG. 28, the gate oxide layer 16 (if not already formed), the polysilicon gate 12, n-epi layer 28, the p-well 14, n layer 30, n+ source 96, p+ region 94, and oxide 92 are then formed, as described with respect to FIGS. 21-24. The p− region 108 forms the channel in the pull-down MOSFET between the p-well 14 and the p+ region 94. A cathode metal is then formed over the surface, as in FIG. 24. FIG. 28 shows a version of the device in which the boron is implanted along only one trench sidewall to form the p− region 108.

Figure 29:
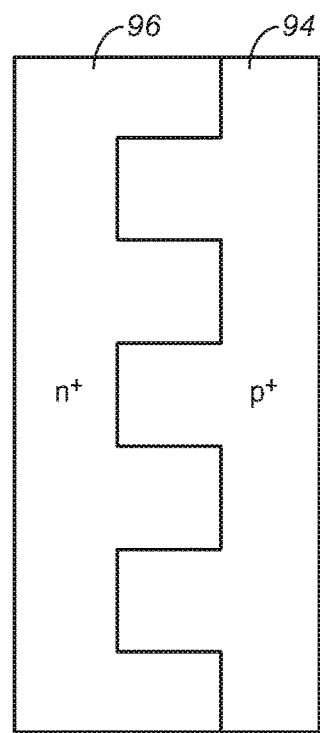
FIG. 29 illustrates one possible top down view of the active area in FIG. 28.

FIG. 29 illustrates one possible top down view of the active area in FIG. 28, showing the p+ region 94 having fingers that extend into the n+ source 96. In such an embodiment, the boron is angle-implanted into only one sidewall of the trench 102.

Figure 30:
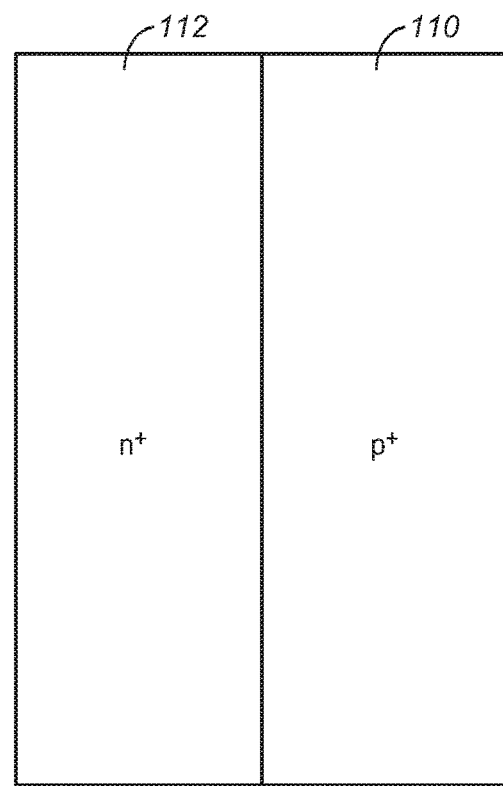
FIG. 30 illustrates another embodiment of a top down view of the active area in FIG. 28 showing the p+ region and n+ source.

FIG. 30 illustrates another embodiment of a top down view of the active area in FIG. 28 showing the p+ region 110 and n+ source 112.

Figure 31:
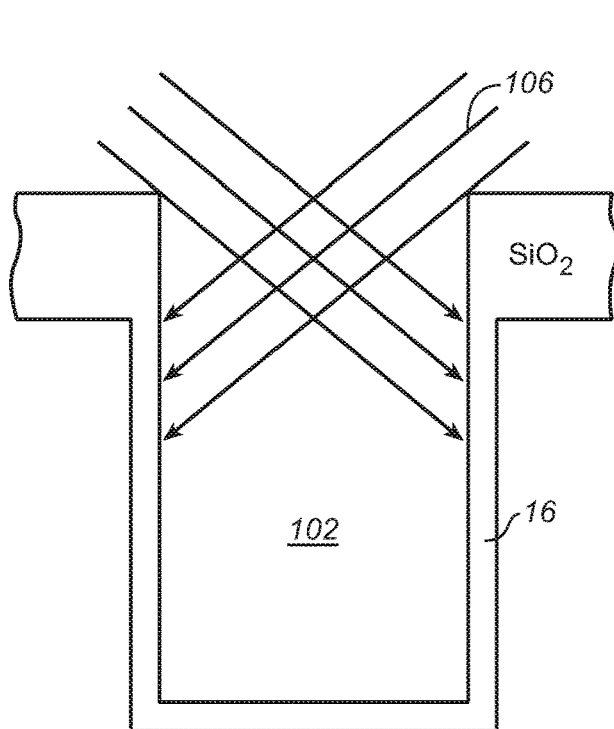
FIG. 31 illustrates the angled implantation of boron into both sidewalls of the trench to form a depletion mode pull-down MOSFET on both sides of a cell for improved turn-off time.

FIG. 31 illustrates the angled implantation of boron 106 into both sidewalls of the trench 102 to change the Vth of the pull-down p-channel MOSFET or to form a depletion mode pull-down MOSFET on both sides of a cell for improved turn-off time.

Figure 32:
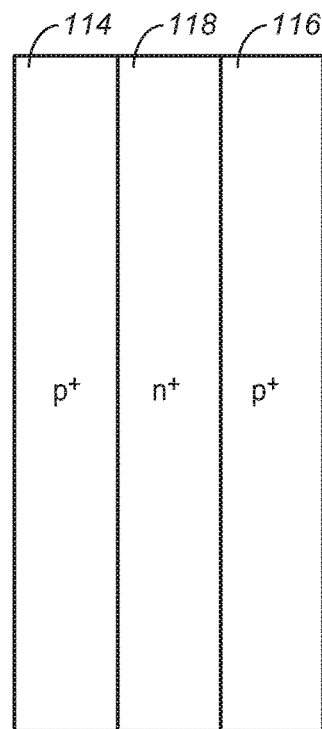
FIG. 32 illustrates one possible top down view of the active area of an IGTO device having the depletion mode pull-down MOSFET on both sides of a cell, formed using the dual angled implants of FIG. 31.

FIG. 32 illustrates one possible top down view of the active area of an IGTO device having the depletion mode pull-down MOSFET on both sides of a cell, formed using the dual angled implants of FIG. 31. The p+ regions 114 and 116 are along the gates, and the n+ source 118 is in the middle. A cathode metal will overlie some portions of the p+ regions 114 and 116 and the n+ source 118.

The angled-implantation technique for forming a depletion mode MOSFET, whether n-channel or p-channel, can be used to form a vertical depletion mode MOSFET in any structure, whether or not the depletion mode MOSFET is used for turning off a device. An angled implant of arsenic into sidewalls of a trench would be used to form a depletion mode n-channel MOSFET.

Figure 34:
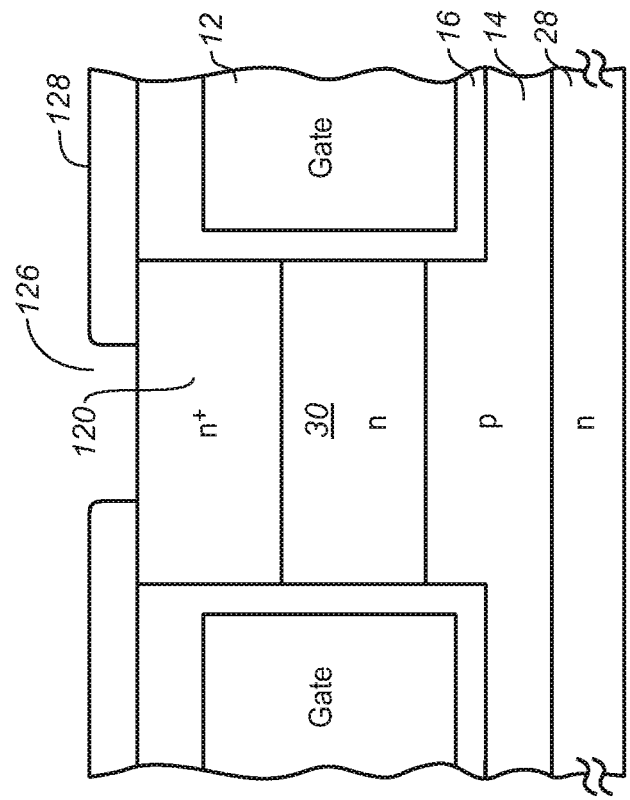
FIG. 34 is taken along line 34-34 in FIG. 33.
Figure 33:
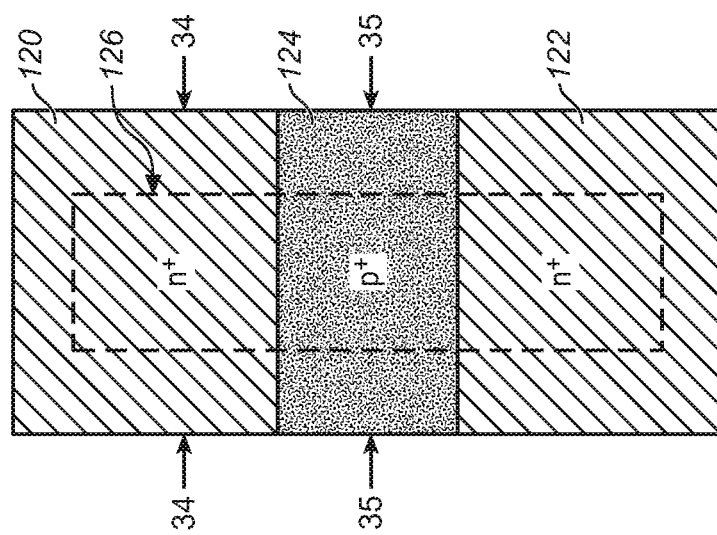
FIG. 33 is a top down view of the active area of an IGTO device cell, showing the n+ sources and the p+ region formed as a horizontal strip.
Figure 35:
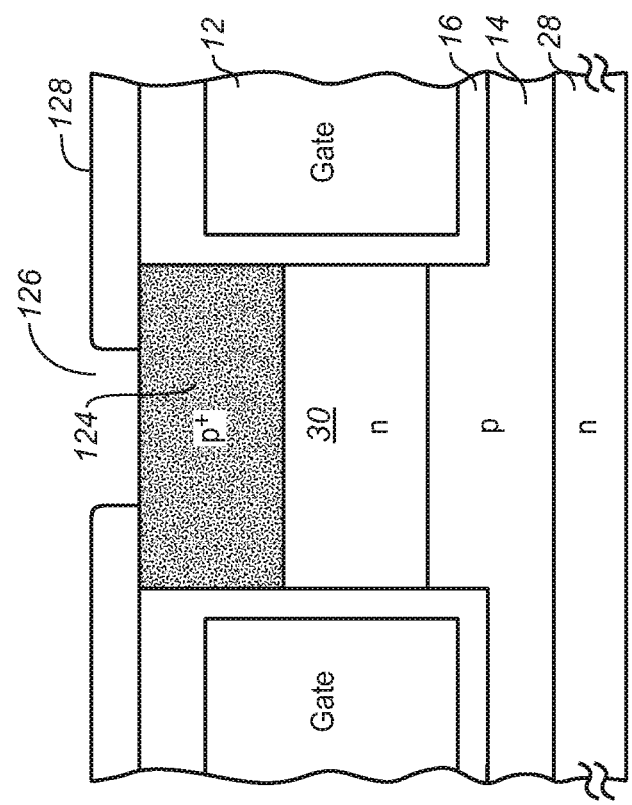
FIG. 35 is taken along line 35-35 in FIG. 33.

FIGS. 33-35 relate to forming a non-self-aligned contact opening for a cathode metal, where the p+ region for the pull-down MOSFET is a single horizontal strip.

FIG. 33 is a top down view of the active area of an IGTO device cell, showing the n+ sources 120 and 122 and the p+ region 124 formed as a horizontal strip. The aligned contact opening 126 in a dielectric layer 128 (FIG. 34) allows the cathode metal to contact the n+ sources 120 and 122 and the p+ region 124. The contact opening 126 can be made very narrow to allow small gate-to-gate spacings.

FIG. 34 is taken along line 34-34 in FIG. 33, and FIG. 35 is taken along line 35-35 in FIG. 33.

Figure 36:
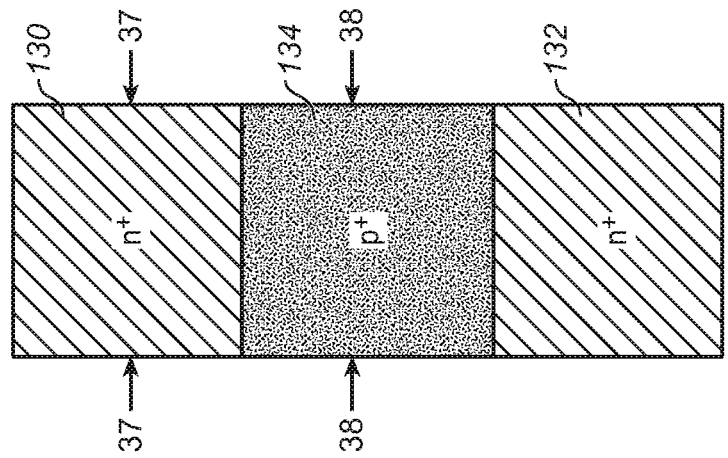
FIG. 36 is a top down view of the active area of an IGTO device cell, showing the n+ sources and the p+ region formed as a horizontal strip.
Figure 38:
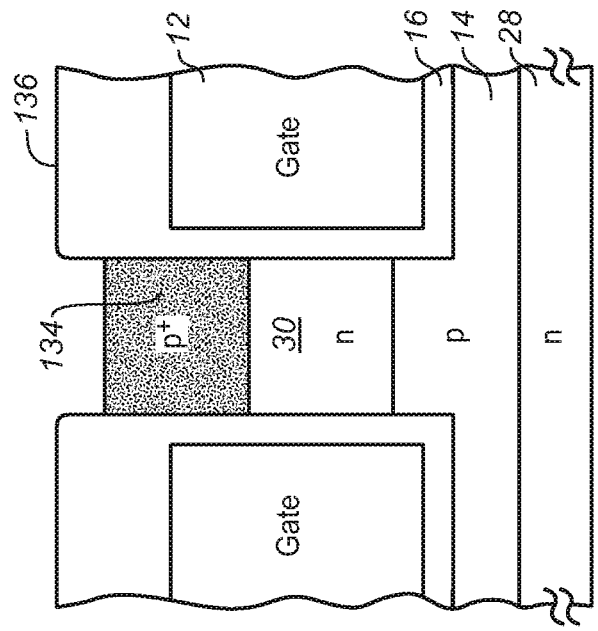
FIG. 38 is taken along line 38-38 in FIG. 36.
Figure 37:
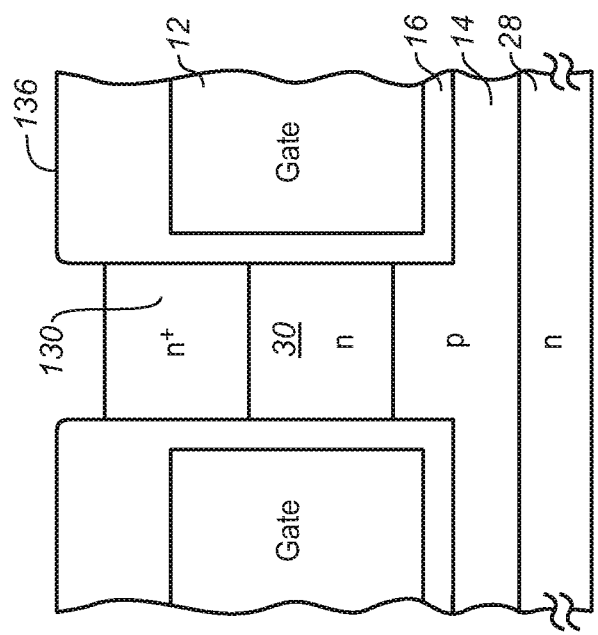
FIG. 37 is taken along line 37-37 in FIG. 36.

FIGS. 36-38 relate to forming a self-aligned contact opening for a cathode metal, where the p+ region for the pull-down MOSFET is a single horizontal strip.

FIG. 36 is a top down view of the active area of an IGTO device cell, showing the n+ sources 130 and 132 and the p+ region 134 formed as a horizontal strip.

FIG. 37 is taken along line 37-37 in FIG. 36, and FIG. 38 is taken along line 38-38 in FIG. 36.

After the trench is formed and filled with polysilicon to form the gate 12, a relatively thick oxide 136 is grown over the polysilicon. A blanket etch removes any thin dielectric over the active area. The resulting exposed area between the gates 12 can then be contacted with a cathode metal layer without requiring the formation of a contact opening, thus saving a few process steps. This is similar to the process shown in FIGS. 21-24.

Figure 39:
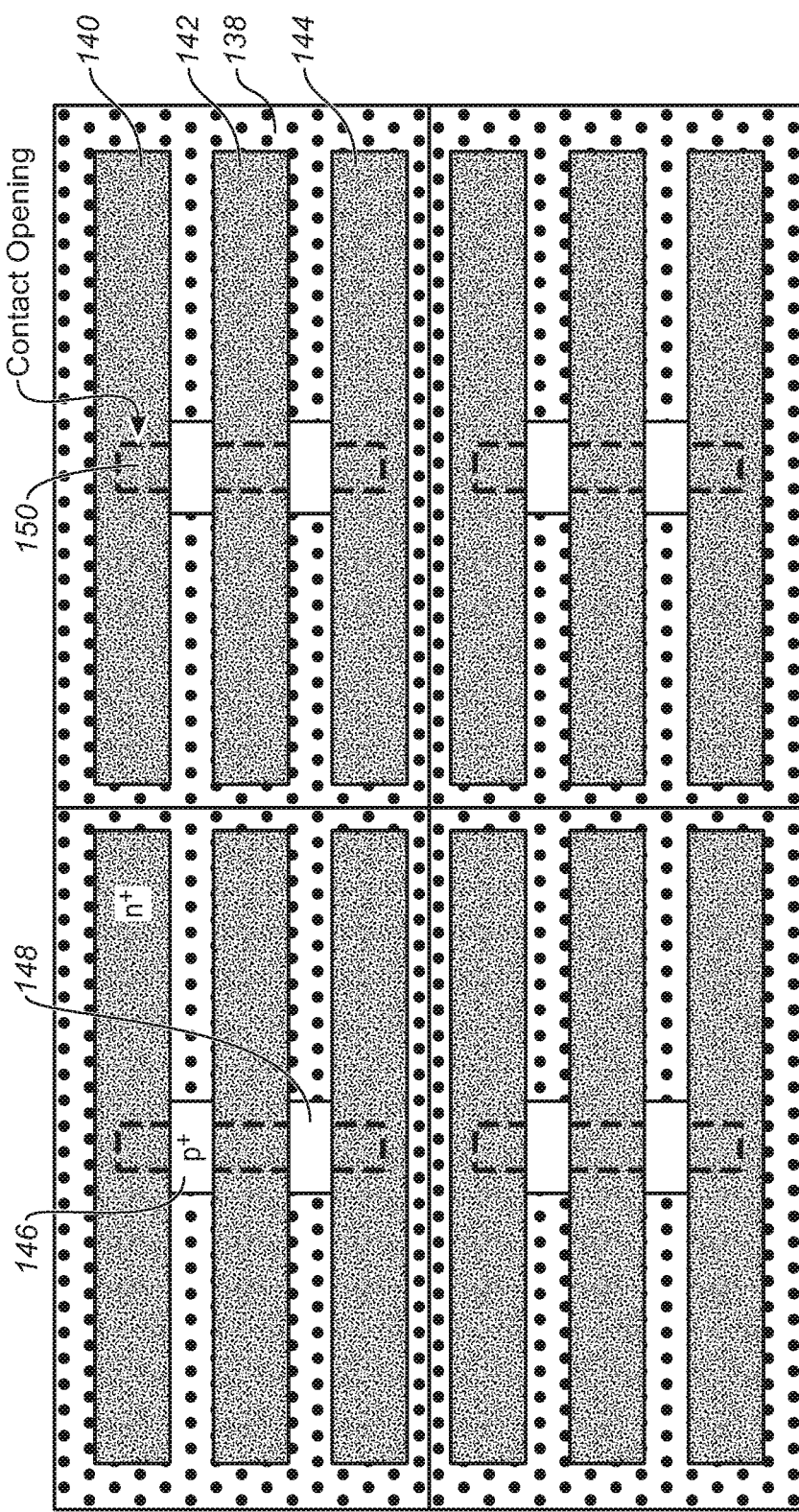
FIG. 39 is a top down view of an array of four cells.

FIG. 39 is a top down view of an array of four cells. The gates 138 are formed in trenches forming a rectangular mesh. Each cell includes the gates 138 (forming a mesh), and three n+ sources 140, 142, and 144, formed as horizontal strips. Each cell also includes p+ regions 146 and 148 between the n+ sources 140, 142, and 144. A contact opening 150 for the cathode metal contacts the n+ sources 140, 142, and 144 and the p+ regions 146 and 148. Only a small portion of the cell is taken up by the p+ regions 146 and 148, resulting in a low Vf. The p+ regions 146 and 148 along the gate walls may be the top regions of a pull-down MOSFET in each cell for turning off the cell. The gates 138 form fingers that extend into each cell to greatly add to the gate surface area to improve efficiency and Vf. The n+ sources 140, 142, and 144 are relatively long and narrow and are virtually surrounded by the gate 138, except for the p+ region areas, so there is low on-resistance. The small area of the pull-down MOSFET is sufficient to greatly reduce the turn-off time.

Figure 40:
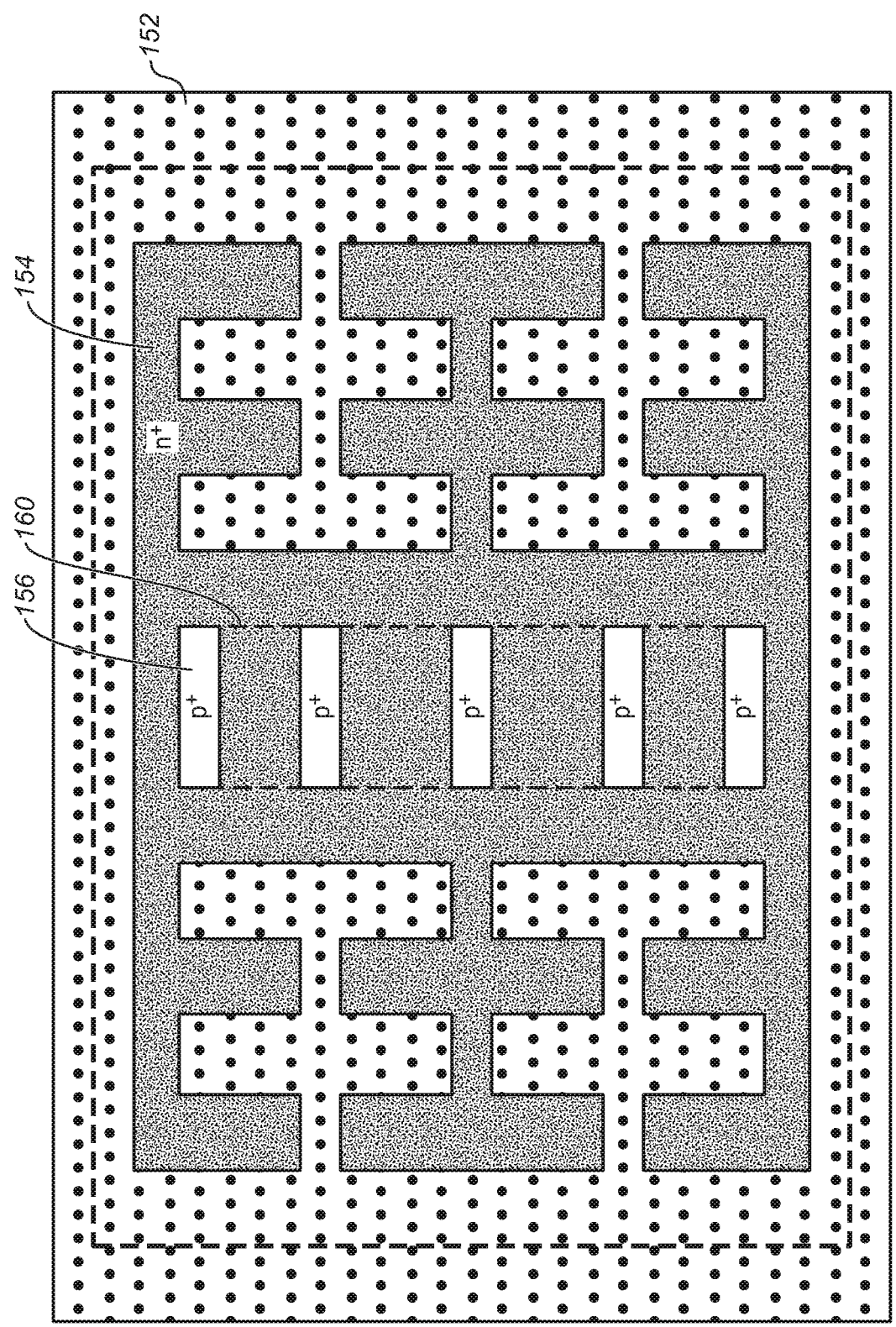
FIG. 40 is a top down view of a cell of an IGTO device, where the gate and the n+ source have interdigitated fingers for abutting along a very large surface area for high efficiency and low Vf.

FIG. 40 is a top down view of a cell of an IGTO device, where the gate 152 and the n+ source 154 have interdigitated fingers for abutting along a very large surface area for high efficiency and low Vf. The p+ regions 156 are portions of pull-down MOSFET devices for rapidly turning off the device. A contact opening 160 allows the cathode metal to contact the n+ source 154 and p+ regions 156. This concept of interdigitated fingers and the integrated pull-down MOSFET can be applied to other types of MOS-gated devices.

Any features described herein can be combined together and can be incorporated in more than one type of trench, MOS-gated power device.

The polarities of the various semiconductor regions may be reversed, depending on whether the top electrode is to be a cathode or an anode.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An electronic device comprising:
a trench in a semiconductor material, the trench having sidewalls;
dopants of a first conductivity type implanted into a portion of at least one sidewall of the trench so that the dopants are not implanted into a lower portion of the sidewall, the implanted dopants for controlling a threshold voltage (Vth) of a MOSFET having a channel along the sidewall of the trench;
a first region of the first conductivity type abutting at least the lower portion of the sidewall and extending below the trench;
a second region of the first conductivity type abutting at least an upper portion of the sidewall such the channel extends between the first region and the second region;
a dielectric layer along the sidewalls of the trench;
a conductive material at least partially filling the trench to form a vertical gate for the MOSFET, wherein a voltage applied to the gate controls a conductivity of the MOSFET; and
a vertical, controllable conduction device, whose conductivity is controlled by the voltage applied to the gate, wherein the controllable conduction device includes at least a vertical bipolar transistor having an emitter and a base,
wherein the MOSFET, in response to a first gate voltage, reduces a base width of the bipolar transistor to turn on the controllable conduction device, and
wherein the MOSFET, in response to a second gate voltage, electrically connects the emitter to the base to turn off the bipolar transistor, which turns off the controllable conduction device.

2. The device of claim 1 wherein the MOSFET is a depletion mode MOSFET.

3. The device of claim 1 where the MOSFET is an enhancement mode MOSFET.

4. The device of claim 1 wherein the electronic device is an Insulated Gate Turn Off (IGTO) device.

5. The device of claim 1 wherein the dopants of the first conductivity type comprise boron and the MOSFET is a p-channel MOSFET.

6. The device of claim 1 wherein the controllable conduction device comprises vertical NPNP layers forming a vertical NPN transistor and a PNP transistor, wherein conduction of the controllable conduction device occurs when a product of gains of the NPN transistor and the PNP transistor exceeds one.

7. The device of claim 1 further comprising:
a third region of a second conductivity type overlying the first region; and
a fourth region of the second conductivity type underlying the first region,
wherein the third region, the first region, and the fourth region form the vertical bipolar transistor.

8. The device of claim 1 wherein the electronic device comprises a plurality of cells connected in parallel, wherein the trench is a portion of a cell that surrounds a remaining portion of the cell of the device, and wherein the second region of the first conductivity type abutting at least the upper portion of the sidewall comprises the second region around only a portion of the trench.

* * * * *